United States Patent [19]

Kompanek

[11] 4,220,887
[45] Sep. 2, 1980

[54] PRESTRESSED, SPLIT CYLINDRICAL ELECTROMECHANICAL TRANSDUCER

[76] Inventor: Harry W. Kompanek, 153 Rametto Rd., Santa Barbara, Calif. 93108

[21] Appl. No.: 965,176

[22] Filed: Nov. 30, 1978

[51] Int. Cl.$^2$ .............................................. H01L 41/10
[52] U.S. Cl. .................................... 310/334; 310/326; 310/337; 310/369
[58] Field of Search ............... 310/369, 371, 337, 325, 310/326, 334, 328; 340/10

[56] References Cited

U.S. PATENT DOCUMENTS

| | | | |
|---|---|---|---|
| 2,812,452 | 11/1957 | Harris | 310/369 X |
| 3,043,967 | 7/1962 | Clearwaters | 310/369 X |
| 3,230,505 | 1/1966 | Parker et al. | 310/369 X |
| 3,325,780 | 6/1967 | Horan | 310/369 X |
| 3,396,285 | 8/1968 | Michenko | 310/325 |

*Primary Examiner*—Mark O. Budd
*Attorney, Agent, or Firm*—Ellsworth R. Roston

[57] ABSTRACT

An electromechanical transducer is made from a member providing for the introduction of electrical energy and the conversion of such energy to mechanical vibrations radially. First means cooperate with the transducer member in limiting the vibrations of the member in a direction for radially contracting the member. When the transducer member has a narrow gap extending along the length of the transducer member, the first means includes a resilient member having a width greater than the width of the gap and disposed in the gap to prestress the transducer member and prevent the ends of the gap from contacting each other during such vibrations. Second means cooperate with the transducer member for limiting the vibrations of the member in a direction for radially expanding the member. The second means include at least one band extending circumferentially around the transducer member for limiting the mechanical vibrations of the member in a direction for expanding the member. Means are provided for introducing electrical signals to the transducer member to produce the mechanical vibrations.

14 Claims, 5 Drawing Figures

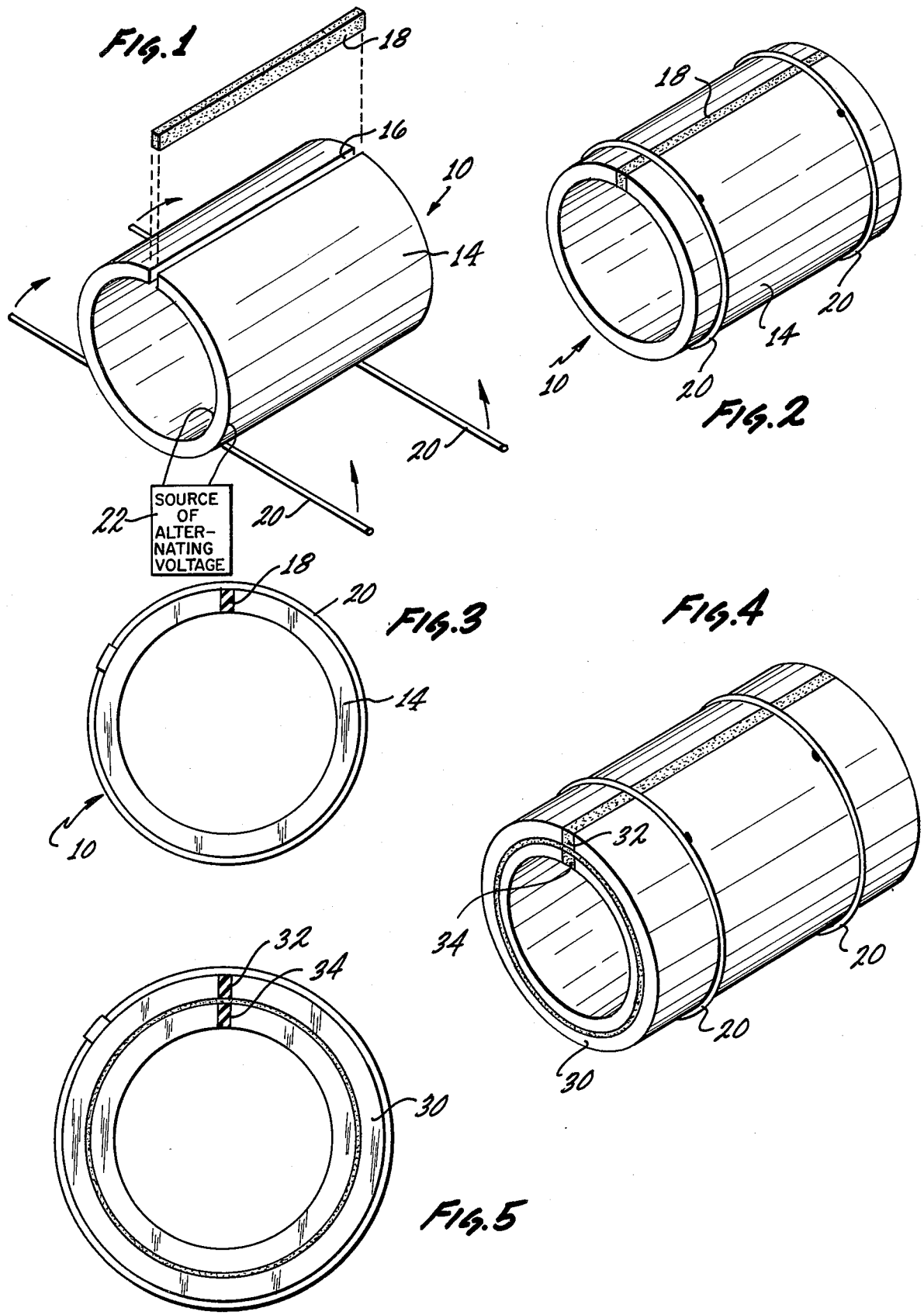

PRESTRESSED, SPLIT CYLINDRICAL ELECTROMECHANICAL TRANSDUCER

This invention relates to electromechanical transducers for converting electrical energy to mechanical energy. More particularly, the invention relates to electromechanical transducers for safely producing significant amounts of mechanical power without damage to the transducer.

Electromechanical transducers are advantageous because they provide a conversion between the electrical energy and mechanical energy. For example, when alternating current signals are introduced to an electromechanical transducer, the transducer vibrates and produces mechanical or acoustical energy in accordance with such vibrations. The conversion of electrical energy to mechanical energy has a number of different uses such as in loud speakers and in sonar applications.

Electromechanical transducers have been known for a considerable number of years. In that period of time, substantial work has been performed to perfect the transducers. In spite of this, several basic problems remain. For example, it has been difficult to convert large amounts of energy safehy from electrical energy to mechanical energy without damaging the transducer. This has been particularly true at such relatively high frequencies as those between approximately fifteen (15) kilohertz and twenty (20) kilohertz. A considerable effort has been made to resolve such difficulties but such efforts have not been entirely successful.

As one example of the prior art, a transducer member has been wrapped with wire and resin to cushion the vibrations of the member. Such wrapping may have had some beneficial effect in cushioning the vibrations of the member but the wrapping also tended to dump the vibrations of the member and also absorb some of the energy produced from such fibrations.

This invention provides an electromechanical transducer which overcomes the above difficulties. The transducer is able to operate safely within particular preset limits to deliver significantly greater amounts of mechanical power than in the prior art. For example, the transducer is able to supply safely, without any fear of damage to the transducer, as much as five (5) to ten (10) times more power than in the prior art. The transducer is able to provide this power with optimal efficiency. The transducer is able to provide such mechanical power at relatively high frequencies, such as between approximately fifteen (15) kilohertz and twenty (20) kilohertz.

The transducer of this invention includes a transducer member which is preferably disposed in the form of a hollow cylinder. The transducer is provided with a gap which is provided with a thin width and which is disposed along the axial length of the transducer member. Means are provided for introducing electrical signals to the transducer member to produce mechanical vibrations in the member.

First means cooperate with the transducer member for limiting the vibrations of the member in a direction for radially contracting the members. The first means may include a resilient member having a width greater than the width of the gap and disposed in the gap to prestress the transducer member and prevent the ends of the gap from contacting each other during such vibrations.

Second means cooperate with the transducer member for limiting the vibrations of the member in a direction for radially expanding the member. The second means include at least one band extending circumferentially around the transducer member for limiting the mechanical vibrations of the member in a direction for expanding the member.

The transducer of this invention has certain important advantages. The first means limit the vibrations of the transducer member in a radially contracting direction and the second means limit the vibrations of the member in a radially expanding direction. In this way, considerable amounts of electrical energy can be introduced to the transducer member with the assurance that the mechanical power produced by the transducer member will not exceed the safe limits of the member. Furthermore, the imposition of the vibrations from a prestressed condition of the transducer member increases the effiency of the operation of the member.

In the drawings:

FIG. 1 is an exploded perspective view of an electromechanical transducer constituting one embodiment of the invention;

FIG. 2 is a perspective view in assembled form of the electromechanical transducer shown in FIG. 1;

FIG. 3 is a sectional view of the transducer shown in FIGS. 1 and 2;

FIG. 4 is a perspective view of a modified electromechanical transducer of this invention; and FIG. 5 is a sectional view of the modified transducer of FIG. 4.

In one embodiment of the invention, a transducer generally indicated at 10 includes a transducer member 14 preferably having a hollow cylindrical configuration. The member 14 may be made from a suitable material such as a lead zirconate lead titanate ceramic or from any other material well known in the prior art. As is well known in the prior art, the member 14 may be provided with a proper ratio of length to diameter to insure operation in a pure "hoop" mode. In other words, the member 14 may be constructed to vibrate in a radial direction.

The member 14 may be provided with a gap 16 extending axially along the length of the member. The gap 16 may be formed by a diamond blade and may be provided with a gap corresponding to the width of the blade. The width of this gap may be a few thousandths of an inch.

The member 14 may then be forcibly expanded outwardly at the position of the gap 16 to open the gap by an additional small distance. This distance may be a few thousandths of an inch. A resilient member 18 made from a suitable material such as a pure rubber or a silicone rubber is then inserted in the gap 16 while the gap is maintained in its opened condition. The resilient member 18 is provided with dimensions to maintain the member 14 in a prestressed condition of a few thousandths of an inch after the member has been released to close the gap 16.

At least one band 20 is then attached to the member 14 at the periphery of the member. Preferably the band 20 is attached as by spot soldering to the member 14 in at least a pair of positions spaced around the periphery of the member 14. The disposition of the band 20 is such that it limits the radial expansion of the member 14. The band 20 may be made from a suitable material such as a braided wire. More than one band may also be used, particularly when the axial length of the transducer is relatively great. Such bands may be spaced axially relative to one another along the length of the transducer.

A source 22 of alternating voltage may be provided. Connections may be respectively made from the source 22 to the inner and outer surfaces of the member 14. Upon the introduction of such signals to the member 14, vibrations are produced in the member in a radial direction.

The vibrations tending to contract the member 14 are limited by the resilient member 18. In this way, the ends of the member defining the gap 16 are not able to contact each other even when the member 14 is subjected to energy levels above its normal limits. This prevents the member 14 from being damaged by the introduction of such excessive energy.

In like manner, the band 20 limits the radial expansion of the member 14 when the member if vibrated. This causes the radial expansion of the member 14 to be maintained within safe limits even when the member is subjected to energy levels above its normal limits.

Since the member cannot be stressed more than its pre-set limits, it can be subjected to sufficient amounts of energy to insure that it will operate at such prestressed limits. As a result, the transducer 10 can produce amounts of power as high as five (5) to ten (10) times greater than the transducers of the prior art. For example, the transducer of this invention has produced five (5) to ten (10) times more power than the solid transducer disclosed in U.S. Pat. No. 4,038,348 issued to me on July 26, 1977.

The transducer of this invention has certain other important advantages. For example, the mechanical Q of the member tends to be increased in the member 14 relative to the mechanical Q of the member before it is cut to produce the gap 16. This may result from the prestressing of the member 14 in its rest position by the insertion of the resilient member 18 in the gap 16.

The frequency of the mechanical vibrations of the member 14 also tends to be increased in comparison to the frequency of the member without any gap in the member. For example, when the member vibrates at a frequency of approximately fifteen (15) kilohertz without any gap, the provision of the gap 16 and the insertion of the resilient member 18 in the gap cause the frequency of vibrations of the member 14 to increase to approximately seventeen (17) kilohertz. This is contrary to what would have been expected by a person skilled in the art.

Instead of disposing the bands 20 directly around the transducer member 14, a cylinder 30 made from a suitable material such as steel may be disposed around the member 14 as illustrated in FIG. 3. The cylinder 30 may be provided with a gap 32 corresponding in dimensions to the gap 16 and a resilient member 34 may be disposed in such gap. Bands 36 may then be attached to the cylinder 30 to limit the radial expansion of the member 14 and the cylinder 30. The cylinder 30 then serves as the member providing the mechanical power. Attachments may be made to this member to provide the output power. The attachments may correspond to those disclosed in application Ser. No. 934,360 filed by me on Aug. 17, 1978.

Although this application has been disclosed and illustrated with reference to particular applications, the principles involved are susceptible of numerous other applications which will be apparent to persons skilled in the art. The invention is, therefore, to be limited only as indicated by the scope of the appended claims.

I claim:

1. An electromechanical transducer, including,
a transducer member having a split configuration and made from a material providing for the introduction of electrical energy and the conversion of this electrical energy to mechanical vibrations of the transducer member in the radial direction,
first means operatively coupled to the transducer member at the split in the member for prestressing the transducer member to limit the vibrations of the transducer member in a direction for radially contracting the transducer member,
second means operatively coupled to the transducer member for limiting the vibrations of the transducer member in a direction for radially expanding the transducer member; and
third means for providing for the introduction of electrical signals to the transducer member to obtain mechanical vibrations of the member in the radial direction.

2. The transducer set forth in claim 1 wherein
the transducer member is provided with a narrow gap extending axially along the length of the transducer member to define the split in the member and the first means includes a resilient member normally having a width greater than the width in the gap and disposed in the gap to prestress the transducer member and prevent the ends of the gap from contacting each other during the mechanical vibrations of the transducer member.

3. The transducer set forth in claim 2 wherein
the gap has a width of a few thousandths of an inch and the resilient member normally has a width a few thousands of an inch greater than the width of the gap to prestress the transducer member.

4. The transducer set forth in claim 1 wherein
the transducer member is in the form of a closed loop interrupted by the split in the transducer member and the second means includes at least one band extending circumferentially around the looped configuration of the transducer member for limiting the mechanical vibrations of the transducer member in a direction for expanding the transducer member.

5. The transducer set forth in claim 4 wherein
the transducer member is provided with a narrow gap extending axially along the length of the transducer member to define the split in the member and the first means includes a resilient member normally having a width greater than the width in the gap and disposed in the gap to prestress the transducer member and prevent the ends of the gap from contacting each other during mechanical vibrations of the transducer member.

6. The transducer set forth in claim 4 wherein
the band is attached to the transducer member in at least a pair of spaced positions circumferentially around the looped configuration of the transducer member.

7. The transducer set forth in claim 6 wherein
the transducer member is provided with external dimensions in the direction of the looped configuration, and the electrical signals are introduced to the transducer member, to produce mechanical vibrations of the transducer member in the radial direction.

8. An electromechanical transducer, including, a cylindrical transducer member made from a material providing for a change of electrical energy to mechanical energy and having a gap of thin circumferential dimensions along the axial length of the transducer member, a resilient member disposed in the gap and normally provided with dimensions greater than those of the gap to prestress the transducer member outwardly, at least one band extending circumferentially around the cylindrical configuration of the transducer member in tight relationship to the transducer member and attached to the transducer member in at least one circumferential position to press the transducer member inwardly, and means for providing for the introduction of electrical signals to the transducer member to obtain mechanical oscillations of the transducer member.

9. The transducer set forth in claim 8 wherein the band is attached to the transducer member to limit the outward vibrations of the transducer member.

10. The transducer set forth in claim 8 wherein the resilient member is normally provided with a thickness slightly greater than the width of the gap to prestress the gap and the band is attached to the transducer member in at least a pair of positions spaced circumferentially around the transducer member.

11. In an electromechanical transducer, a transducer member having a split configuration to provide for a conversion between electrical energy and mechanical vibrations of the member, and means disposed in the split in the transducer member for prestressing the transducer member outwardly to limit the inward vibrations of the transducer member.

12. In the transducer set forth in claim 11, the transducer member being provided with a narrow gap extending along the length of the transducer member to define the split in the member and the prestressing means including a resilient member normally having a width greater than the width of the gap and disposed in the gap to prestress the transducer member and prevent the ends of the gap from contacting each other during the mechanical vibrations of the transducer member.

13. In the transducer set forth in claim 12, the gap having a width of a few thousandths of an inch and the resilient member normally having a width a few thousandths of an inch greater than the width of the gap to prestress the transducer member.

14. In the transducer member set forth in claim 12, means for providing for the introduction of electrical energy to the member to vibrate the member.

* * * * *